US010916659B2

(12) United States Patent
Reznicek et al.

(10) Patent No.: US 10,916,659 B2
(45) Date of Patent: Feb. 9, 2021

(54) ASYMMETRIC THRESHOLD VOLTAGE FINFET DEVICE BY PARTIAL CHANNEL DOPING VARIATION

(71) Applicant: International Business Machines Corporation, Armonk, NY (US)

(72) Inventors: Alexander Reznicek, Troy, NY (US); Choonghyun Lee, Rensselaer, NY (US); Pouya Hashemi, White Plains, NY (US); Takashi Ando, Tuckahoe, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 16/134,543

(22) Filed: Sep. 18, 2018

(65) Prior Publication Data

US 2020/0091344 A1 Mar. 19, 2020

(51) Int. Cl.

| | |
|---|---|
| ***H01L 29/78*** | (2006.01) |
| ***H01L 29/66*** | (2006.01) |
| ***H01L 21/265*** | (2006.01) |
| ***H01L 29/08*** | (2006.01) |
| ***H01L 21/308*** | (2006.01) |
| ***H01L 29/10*** | (2006.01) |

(52) U.S. Cl.
CPC ........ *H01L 29/7851* (2013.01); *H01L 21/265* (2013.01); *H01L 21/3086* (2013.01); *H01L 29/0847* (2013.01); *H01L 29/1041* (2013.01); *H01L 29/66545* (2013.01); *H01L 29/66553* (2013.01)

(58) Field of Classification Search
CPC ............... H01L 29/7851; H01L 29/785; H01L 29/4966; H01L 29/0847; H01L 29/66553; H01L 29/66545; H01L 29/1041
See application file for complete search history.

(56) References Cited

U.S. PATENT DOCUMENTS 8,227,316 B2 * 7/2012 Zhu .................. H01L 29/66795
257/618
8,298,895 B1 10/2012 Alptekin
8,853,025 B2 10/2014 Zhang et al.
8,941,189 B2 1/2015 Chowdhury et al.
9,640,660 B2 5/2017 Yin et al.
(Continued)

OTHER PUBLICATIONS

Narasiimhulu, et al., "Impact of lateral asymmetric channel doping on deep submicrometer mixed signal device and circuit performance", IEEE Transactions on Electron Devices, Dec. 2003, pp. 2481-2489, vol. 50, No. 12.
(Continued)

*Primary Examiner* — Hoa B Trinh
(74) *Attorney, Agent, or Firm* — Scully, Scott, Murphy & Presser, P.C.; L. Jeffrey Kelly, Esq.

(57) ABSTRACT

A FinFET having an asymmetric threshold voltage distribution is provided by forming a halo ion implantation region in a semiconductor fin, and in close proximity to a source region, of the FinFET. The halo ion implantation region is self-aligned to an outermost sidewall surface of the functional gate structure of the FinFET and it has a higher dopant concentration than the remaining portion of the channel region.

13 Claims, 7 Drawing Sheets

(56) References Cited

U.S. PATENT DOCUMENTS

| | | | |
|---|---|---|---|
| 9,716,155 | B2 | 7/2017 | Balakrishnan et al. |
| 9,735,275 | B2 | 8/2017 | Karve et al. |

OTHER PUBLICATIONS

Baek, et al., "Device Optimization of N-Channel MOSFETs with Lateral Asymmetric Channel Doping Profiles", Transactions on Electrical and Electronic Materials, Feb. 25, 2010, pp. 15-19, vol. 11, No. 1.

* cited by examiner

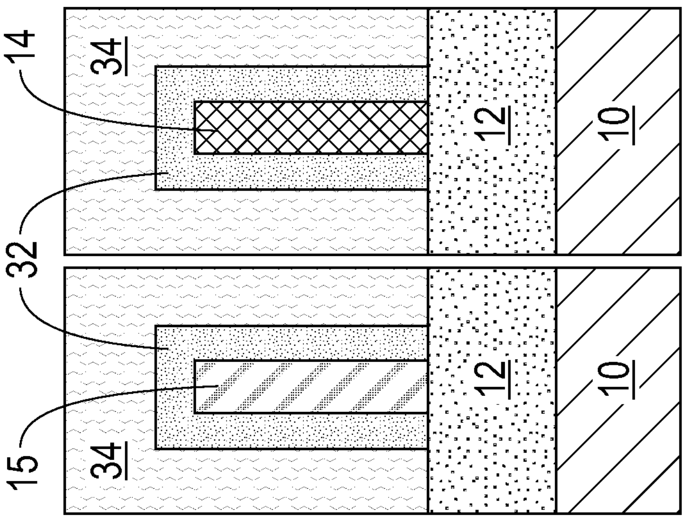
FIG. 10C
FIG. 10B
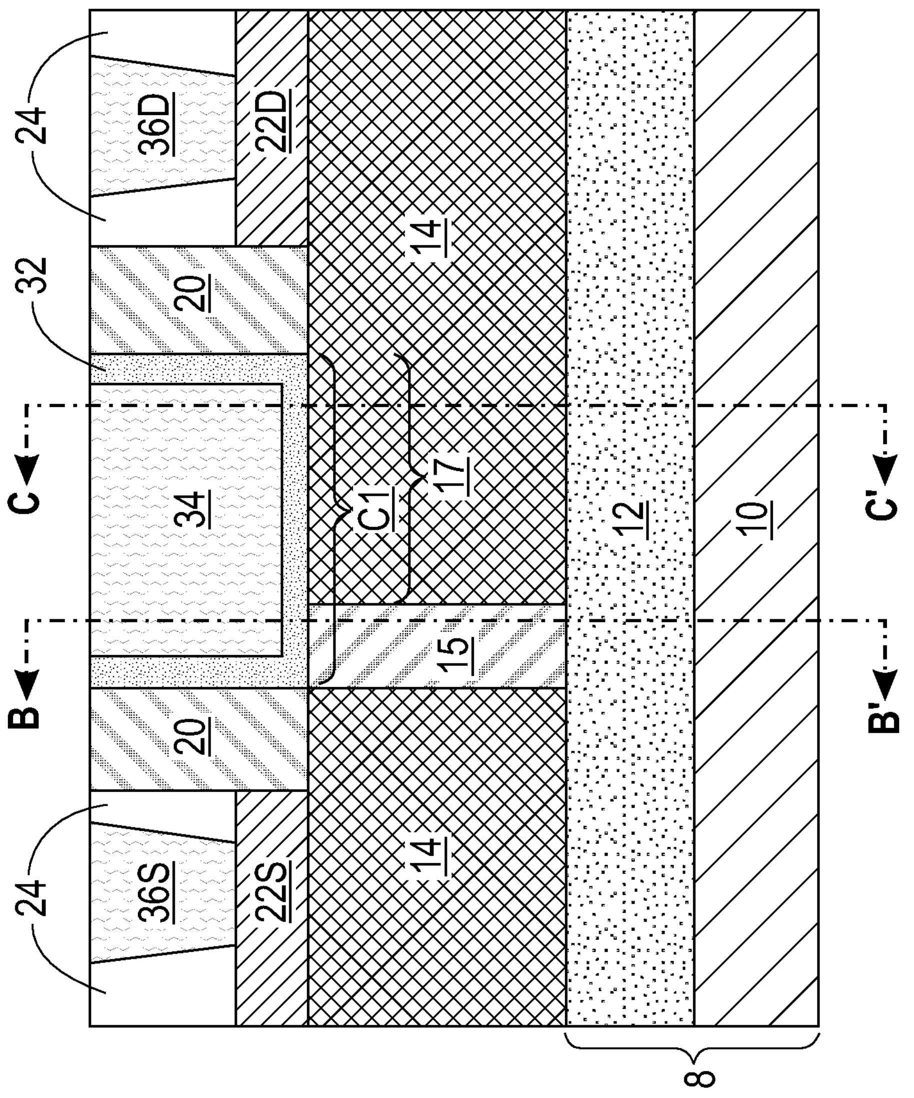
FIG. 10A

ASYMMETRIC THRESHOLD VOLTAGE FINFET DEVICE BY PARTIAL CHANNEL DOPING VARIATION

BACKGROUND

The present application relates to a semiconductor structure and a method of forming the same. More particularly, the present application relates to a FinFET having an asymmetric threshold voltage distribution which is provided by a threshold voltage modifying structure that is formed in a channel region, and in close proximity to a source region, of the FinFET.

The lateral asymmetric channel (LAC) doping profile approach provides one of the most effective ways to improve the electrical characteristics of field effect transistors (FETs). For LAC devices, the doping concentration of the source side is higher than that of the drain side in the channel region. The channel potential transition at the source side channel region is much stepper than that of the other channel regions, while the device is operating due to non-uniform channel doping. Such a steep potential distribution near the source side enhances the lateral channel electric field and this increases the carrier mobility.

The LAC doping approach, however, suffers from channel dopant diffusion and dopant variation. Also, it is difficult to design short channel devices using the LAC doping approach. As such, there is a need for providing a semiconductor structure having an asymmetric threshold voltage distribution that is formed without using the LAC doping approach.

SUMMARY

A FinFET having an asymmetric threshold voltage distribution is provided by forming a halo ion implantation region in a semiconductor fin, and in close proximity to a source region, of the FinFET. The halo ion implantation region is self-aligned to an outermost sidewall surface of the functional gate structure of the FinFET and it has a higher dopant concentration than the remaining portion of the channel region.

In one aspect of the present application, a semiconductor structure is provided. In one embodiment, the semiconductor structure includes a functional gate structure located on a channel region of a semiconductor fin. A source structure is located on the semiconductor fin and is present on a source side of the functional gate structure, and a drain structure is located on the semiconductor fin and present on a drain side of the functional gate structure. The channel region includes a non-halo ion implantation region and a halo ion implantation region. The halo ion implantation region has a higher dopant concentration than the non-halo ion implantation region, is located on the source side and is laterally adjacent to the non-halo implantation region.

In another aspect of the present application, a method of forming a semiconductor structure is provided. In one embodiment, the method includes forming a structure including a sacrificial gate structure on a surface of a semiconductor fin, wherein an inner space and an outer spacer laterally surround the sacrificial gate structure, and wherein a source structure is present on a source side of the sacrificial gate structure and a drain structure is present on a drain side of the sacrificial gate structure. The inner spacer on the source side of the sacrificial gate structure is removed to physically expose a portion of the semiconductor fin on the source side. A halo ion implantation region is formed into the physically exposed portion of the semiconductor fin on the source side. The inner spacer on the drain side and the sacrificial gate structure are then removed to provide a gate cavity located above a channel region of the semiconductor fin and between the outer spacers, wherein the channel region includes the halo ion implantation region. A functional gate structure is formed in the gate cavity and above the channel region of the semiconductor fin.

BRIEF DESCRIPTION OF THE DRAWINGS

FIG. 10A is a cross sectional view of the exemplary semiconductor structure of FIG. 9A after forming a functional gate structure.

FIG. 10B is a cross sectional view of the exemplary semiconductor structure of FIG. 9A through line B-B'.

FIG. 10C is a cross sectional view of the exemplary semiconductor structure of FIG. 9A through line C-C'.

DETAILED DESCRIPTION

Figure 1:
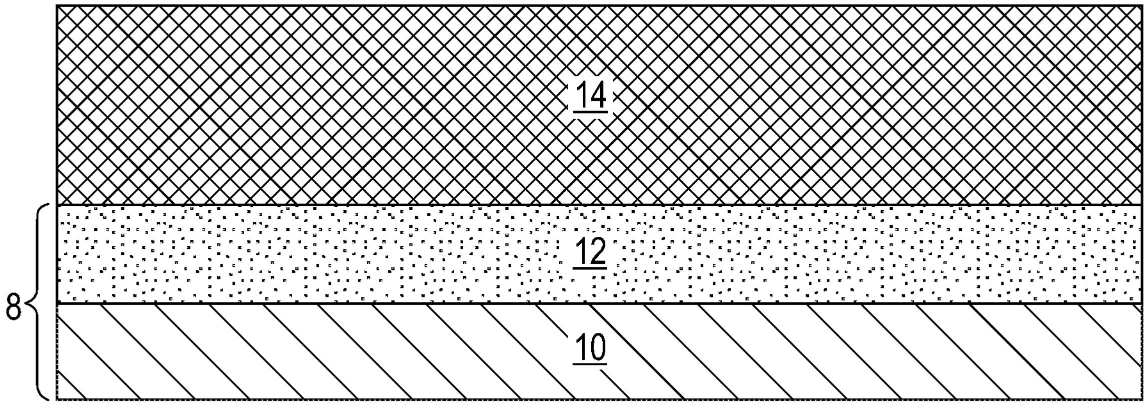
FIG. 1 is a cross sectional view of an exemplary semiconductor structure including a semiconductor fin located on a surface of a substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a semiconductor fin 14 located on a surface of a substrate 8. Although the present application describes and illustrates a single semiconductor fin 14, the present application can be used in embodiments in which more than one semiconductor fin is formed. In such an embodiment, each semiconductor fin is orientated parallel to each other.

In some embodiments of the present application (and as is shown), the semiconductor fin 14 is formed upon a substrate 8 that includes an insulator layer 12 and a handle substrate 10. In some embodiments, the handle substrate 10 may include a semiconductor material. The term "semiconductor material" denotes a material that has semiconducting properties. Examples of semiconductor materials include, for example, silicon (Si), a silicon germanium (SiGe) alloy, a silicon germanium carbide (SiGeC) alloy, germanium (Ge), a III/V compound semiconductor, or a II/VI compound semiconductor. In other embodiments, the handle substrate 10 may be omitted, or the handle substrate 10 may be composed of a conductive material and/or an insulator material. The insulator layer 12 may include a crystalline or non-crystalline dielectric material. In one example, the insulator layer 12 may be composed of silicon dioxide and/or boron nitride.

In some embodiments (not shown), the semiconductor fin 14 is formed upon a substrate 8 that includes a remaining portion of a bulk semiconductor substrate. The term "bulk semiconductor substrate" denotes a substrate that is composed entirely of one or more semiconductor materials, as defined above. In one example, the bulk semiconductor substrate and thus substrate 8 is composed entirely of Si.

The semiconductor structure shown in FIG. 1 can be formed by first providing a base substrate that includes an upper semiconductor material layer. The base substrate may include a bulk semiconductor substrate or a semiconductor-on-insulator (SOI) substrate. The SOI substrate would include the handle substrate 10, the insulator layer 12, and a topmost semiconductor material which will be subsequently patterned into a semiconductor fin 14. The upper semiconductor material layer of the base substrate is then patterned to provide at least one semiconductor fin 14 that is present on a non-patterned portion of the base substrate (i.e., substrate 8). In some embodiments, a hard mask can be present atop the upper semiconductor material layer of the base substrate prior to patterning and can be removed after patterning of the upper semiconductor material layer.

In one embodiment, the patterning of the upper semiconductor material layer of the base substrate may include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process (i.e., pattern transfer etch) includes a dry etching process (such as, for example, reactive ion etching, ion beam etching, plasma etching or laser ablation), and/or a wet chemical etching process. After pattern transfer, the patterned photoresist may be removed utilizing a conventional photoresist stripping process such as, for example, ashing.

In another embodiment, the patterning of the upper semiconductor material layer of the base substrate may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the upper semiconductor material layer of the base substrate may include a direct self-assembly (DSA) process in which a copolymer that is capable of direct self-assembly is used.

After patterning of the upper semiconductor material layer of the base substrate, at least one semiconductor fin 14 is formed on a non-patterned portion of the base substrate (i.e., substrate 8). In embodiments in which a bulk semiconductor substrate is employed, substrate 8 and the semiconductor fin 14 may be composed of a same semiconductor material, i.e., silicon. Also, and in embodiments in which a bulk semiconductor substrate is employed, substrate 8 and the semiconductor fin 14 may be composed of different semiconductor materials.

As used herein, a "semiconductor fin" refers to a structure composed of a semiconductor material, as defined above, that includes a pair of vertical sidewalls that are parallel to each other. A surface is "vertical" if there exists a vertical plane from which the surface does not deviate by more than three times the root mean square roughness of the surface. In one embodiment, the semiconductor fin 14 has a height from 20 nm to 200 nm, a width from 5 nm to 30 nm, and a length from 20 nm to 200 nm. Other heights and/or widths and/or lengths that are lesser than, or greater than, the ranges mentioned herein can also be used in the present application. When a plurality of semiconductor fins are present on substrate 8, each semiconductor fin is spaced apart from its nearest neighboring semiconductor fin by a pitch of from 20 nm to 100 nm; the pitch is measured from one point of one semiconductor fin to the exact point on a neighboring semiconductor fin.

Figure 2:
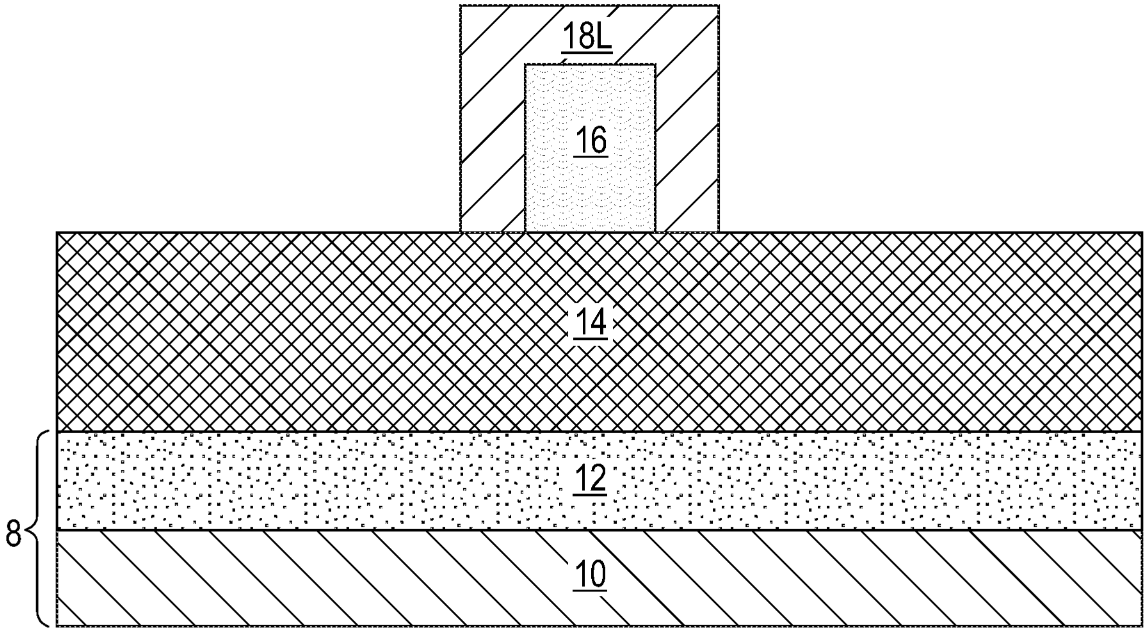
FIG. 2 is a cross sectional view of the exemplary semiconductor structure of FIG. 1 after forming a sacrificial gate structure and a first spacer layer on a surface of the semiconductor fin.

Referring now to FIG. 2, there is illustrated the exemplary semiconductor structure of FIG. 1 after forming a sacrificial gate structure 16 and a first spacer layer 18L on a surface of the semiconductor fin 14. The sacrificial gate structure 16 and the first spacer layer 18L are located on a first side and a second side of the fin structure 14, and span across a topmost surface of a portion of the semiconductor fin 14. The sacrificial gate structure 16 and the first spacer layer 18L thus straddle the semiconductor fin 14.

The sacrificial gate structure 16 may include a single sacrificial material or a stack of two or more sacrificial materials (i.e., the sacrificial gate structure 16 includes at least one sacrificial material). In one embodiment, the at least one sacrificial material comprises, from bottom to top, a sacrificial gate dielectric material, a sacrificial gate material and a sacrificial dielectric cap. In some embodiments, the sacrificial gate dielectric material and/or the sacrificial dielectric cap can be omitted and only a sacrificial gate material is formed. The at least one sacrificial material can be formed by forming a blanket layer (or layers) of a material (or various materials) and then patterning the material (or various materials) by lithography and an etch. In one embodiment, the at least one sacrificial material can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate dielectric material. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of the sacrificial materials), lithography and etching can be used to pattern the sacrificial material stack (or any subset of the sacrificial materials) and to provide the sacrificial gate structure 16.

The first spacer layer 18L is composed of a first dielectric spacer material. One example of a first dielectric spacer material that may be employed in the present application is silicon nitride. The first spacer layer 18L may be formed by deposition of a first dielectric spacer material, followed by a spacer etch. The deposition of the first dielectric spacer material includes, for example, chemical vapor deposition (CVD), plasma enhanced chemical vapor deposition (PECVD), or physical vapor deposition (PVD). The spacer etch may include a reactive ion etch.

Figure 3:
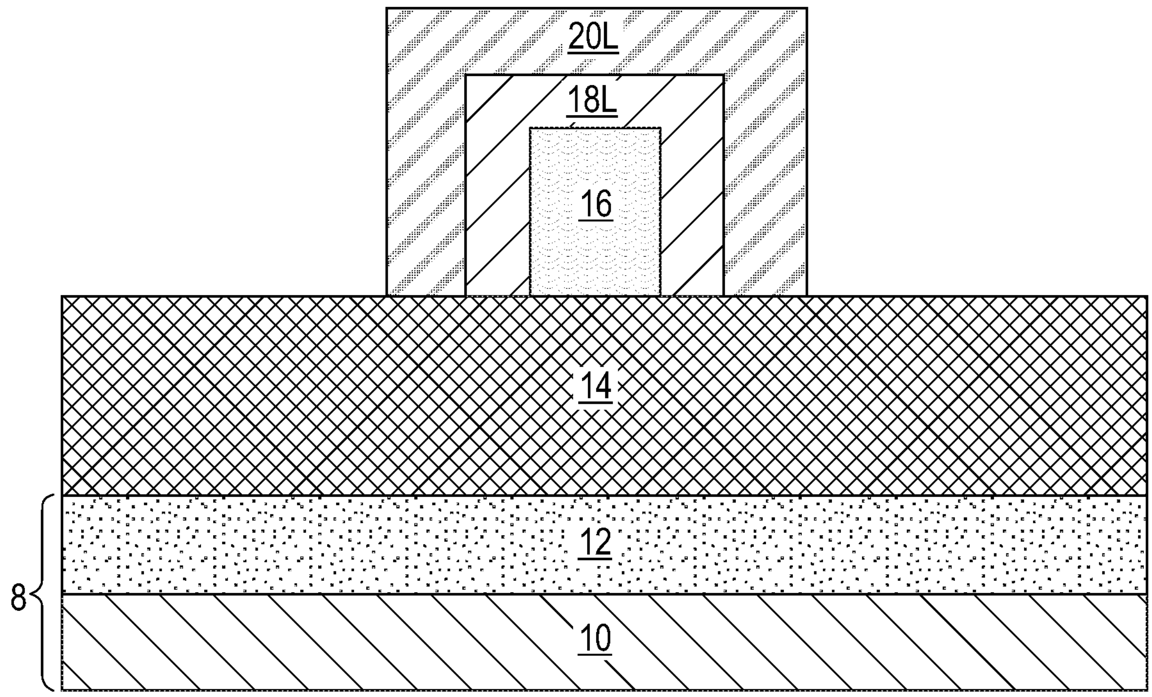
FIG. 3 is a cross sectional view of the exemplary semiconductor structure of FIG. 2 after forming a second spacer layer on the first spacer layer.

Referring now to FIG. 3, there is illustrated the exemplary semiconductor structure of FIG. 2 after forming a second spacer layer 20L on the first spacer layer 18L. The second spacer layer 20L is composed of a second dielectric spacer material that is compositionally different from the first dielectric spacer material. One example of a second dielectric spacer material that may be employed in the present application is silicon dioxide. The second spacer layer 20L may be formed by deposition of the second dielectric spacer material, followed by a spacer etch. The deposition process that can be employed in providing the second dielectric spacer material includes, for example, chemical vapor deposition (CVD), plasma enhanced chemical vapor deposition (PECVD), or physical vapor deposition (PVD). The spacer etch can include a reactive ion etch. The second spacer layer 20L has a lateral width that is greater than a laterally width of the first spacer layer 18L.

Figure 4:
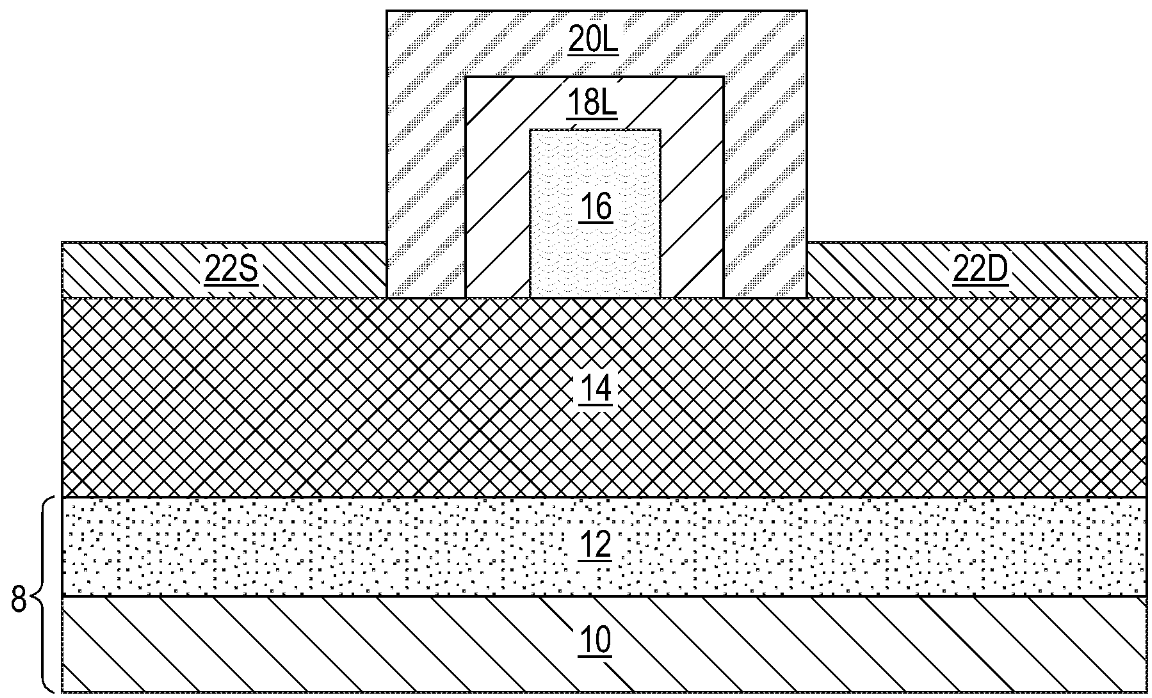
FIG. 4 is a cross sectional view of the exemplary semiconductor structure of FIG. 3 after forming a source structure on one side (i.e., the source side) of the sacrificial gate structure and a drain structure on another side (i.e., the drain side) of the sacrificial gate structure.

Referring now to FIG. 4, there is illustrated the exemplary semiconductor structure of FIG. 3 after forming a source structure 22S on one side (i.e., the source side) of the sacrificial gate structure 16 and a drain structure 22D on another side (i.e., the drain side) of the sacrificial gate structure 16. The source structure 22S will serve as a source region of the resultant FinFET, while the drain structure 22D will serve as a drain region of the resultant FinFET.

Each of the source structure 22S and the drain structure 22D is composted of a semiconductor material and a dopant. The semiconductor material that provides the source structure 22S and the drain structure 22D can be selected from one of the semiconductor materials mentioned above for the handle substrate 10. In some embodiments of the present application, the semiconductor material that provides the source structure 22S and the drain structure 22D may be composed of silicon.

The dopant that is present in the source structure 22S and the drain structure 22D can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, the source structure 22S and the drain structure 22D may have a dopant concentration of from $4\times10^{20}$ atoms/$cm^3$ to $3\times10^{21}$ atoms/$cm^3$. In one embodiment, the source structure 22S and the drain structure 22D are composed of phosphorous doped silicon.

In one embodiment, the dopant that can be present in the source structure 22S and the drain structure 22D can be introduced into the precursor gas that provides the source structure 22S and the drain structure 22D. In another embodiment, the dopant can be introduced into an intrinsic semiconductor layer by utilizing one of ion implantation or gas phase doping.

The source structure 22S and the drain structure 22D are formed by utilizing an epitaxial growth process. The term "epitaxial growth" means the growth of a second semiconductor material on a growth surface of a first semiconductor material, in which the second semiconductor material being grown has the same crystalline characteristics as the first semiconductor material. In an epitaxial deposition process, the chemical reactants provided by the source gases are controlled and the system parameters are set so that the depositing atoms arrive at the growth surface of the first semiconductor material with sufficient energy to move around on the growth surface and orient themselves to the crystal arrangement of the atoms of the growth surface. Therefore, an epitaxial material has the same crystalline characteristics as the growth on surface on which it is formed. In the present application, the source structure 22S and the drain structure 22D have a same crystalline characteristic as the semiconductor fin 14.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the source structure 22S and the drain structure 22D can be performed utilizing any well known precursor gas or gas mixture. Carrier gases like hydrogen, nitrogen, helium and argon can be used.

Figure 5:
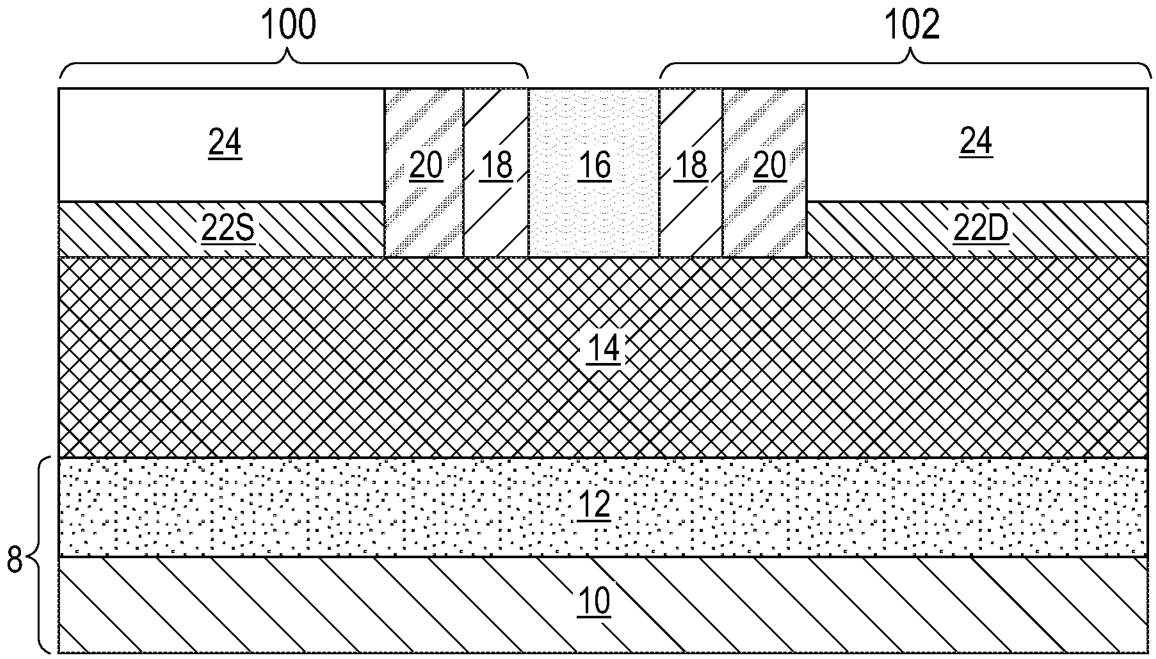
FIG. 5 is a cross sectional view of the exemplary semiconductor structure of FIG. 4 after forming an interlayer dielectric (ILD) material, and performing a planarization process to remove the ILD material, and the first and second gate layers that are located above the sacrificial gate structure and to provide an ILD layer, and first and second spacers.

Referring now to FIG. 5, there is illustrated the exemplary semiconductor structure of FIG. 4 after forming an interlayer dielectric (ILD) material (not specifically shown), and performing a planarization process to removing the ILD material, and the first and second spacer layers (18L, 20L) that are located above the sacrificial gate structure 16 and to provide an ILD layer 24, and first and second spacers (18, 20). Each first spacer 18 may be referred to herein as an inner spacer, while each second spacer 20 may be referred to herein as an outer spacer.

The ILD material is composed of a dielectric material that is compositionally different from the dielectric material of either the first and second spacer layers (18L, 20L). Examples of ILD materials that can be used in the present application include silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide.

In one embodiment, the ILD material can be formed by a deposition process such as, for example, chemical vapor deposition (CVD), plasma enhanced chemical vapor deposition (PECVD), evaporation or spin-on coating. Following the deposition of the ILD material, a planarization process such as, for example, chemical mechanical polishing (CMP) and/or grinding, is employed. The planarization process removes the ILD material, and the first and second gate layers (18L, 20L) that are located above the sacrificial gate structure 16. After planarization, an ILD layer 24 is provided, as well as first and second spacers (18, 20). The ILD layer 24 represents a portion of the ILD material that remains after planarization. Each first spacer 18 represents a portion of the first spacer layer 18L that remains after planarization, while each second spacer 20 represents a portion of the second spacer layer 20L that remains after planarization. A first spacer 18 and a second spacer 20 are present on each side (i.e., the source side 100 and the drain side 102) of the sacrificial gate structure 16. As is shown, the ILD layer 24 has a topmost surface that is coplanar with a topmost surface of the sacrificial gate structure 16, the first spacers 18, and the second spacers 20.

Figure 6:
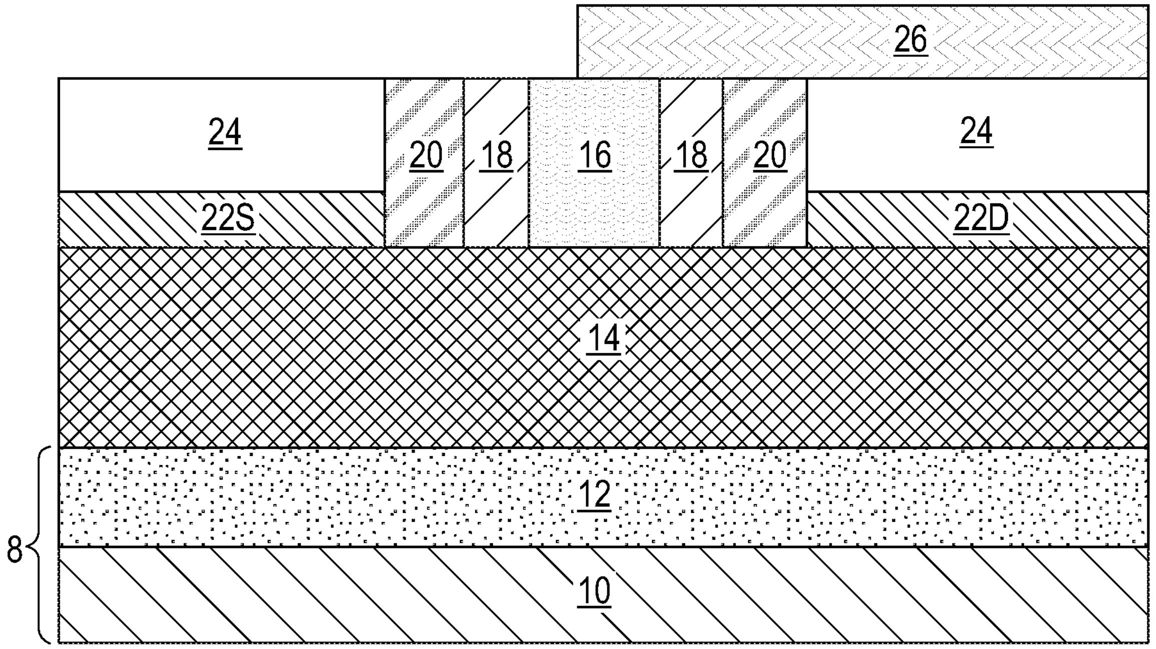
FIG. 6 is a cross sectional view of the exemplary semiconductor structure of FIG. 5 after forming a mask on the drain side of the structure, wherein a portion of the mask is present on a topmost surface of the sacrificial gate structure.

Referring now to FIG. 6, there is illustrated the exemplary semiconductor structure of FIG. 5 after forming a mask 26 on the drain side 102 of the structure, wherein a portion of the mask 26 is present on a topmost surface of the sacrificial gate structure 16; mask 26 extends across the first and second spacers (18, 20) that are present on the drain side 102 of the structure. In some embodiments, mask 26 only partially covers the sacrificial gate structure 16. In yet other embodiments, mask 26 completely covers the sacrificial gate structure 16.

Mask 26 is composed of a masking material that is compositionally different from the ILD layer 24, the first spacer 18 and the second spacer 20. In one embodiment, the mask 26 is composed of silicon dioxide, silicon nitride, or silicon oxide nitride. The mask 26 may be formed by deposition of a masking material and then patterning the masking material by lithography and etching. Mask 26 may have a thickness from 10 nm to 50 nm, although other thicknesses are possible and can be used in the present application.

Figures 7A, 7B, 7C:
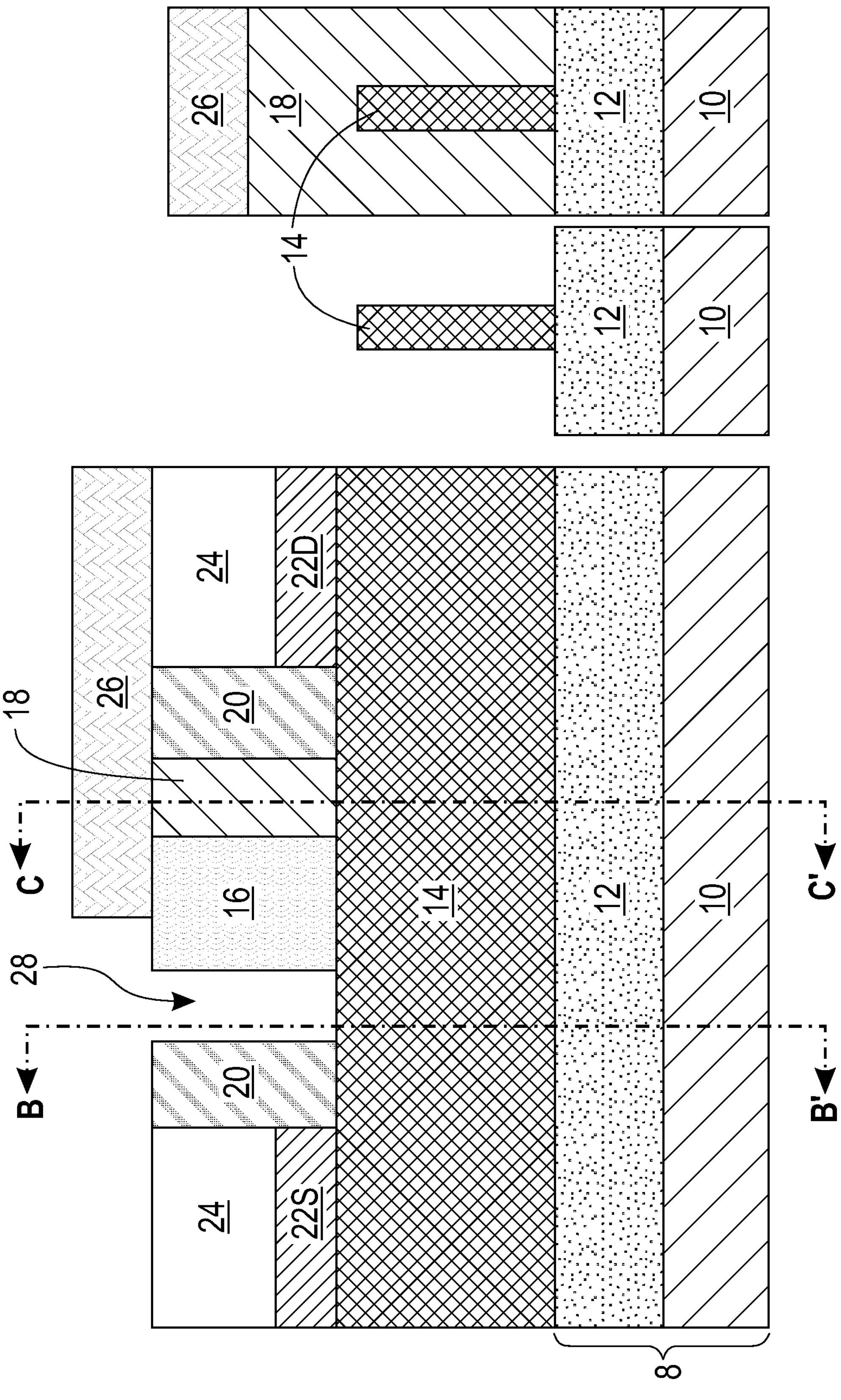
FIG. 7A is a cross sectional view of the exemplary semiconductor structure of FIG. 6 after removing the first spacer that is present on the source side of the structure to physically expose a portion of the semiconductor fin on the source side of the structure.
FIG. 7B is a cross sectional view of the exemplary semiconductor structure of FIG. 7A through line B-B'.
FIG. 7C is a cross sectional view of the exemplary semiconductor structure of FIG. 7A through line C-C'.

Referring now to FIGS. 7A, 7B and 7C, there are illustrated various views of the exemplary semiconductor structure of FIG. 6 after removing the first spacer 18 that is present on the source side 100 of the structure to physically expose a portion of the semiconductor fin 14 on the source side 100 of the structure. As is shown in FIG. 7B, a topmost surface and sidewall surfaces of the semiconductor fin 14 are exposed. The removal of the first spacer 18 is performed utilizing an etching process that is selective for removing the first spacer 18 relative to the ILD layer 24, the second spacer 20 and the sacrificial gate structure 16. A cavity 28 is formed after the removal of the first spacer 18 from the source side 100 of the structure. Cavity 28 physically exposes a portion of the semiconductor fin 14.

Figures 8A, 8B, 8C:
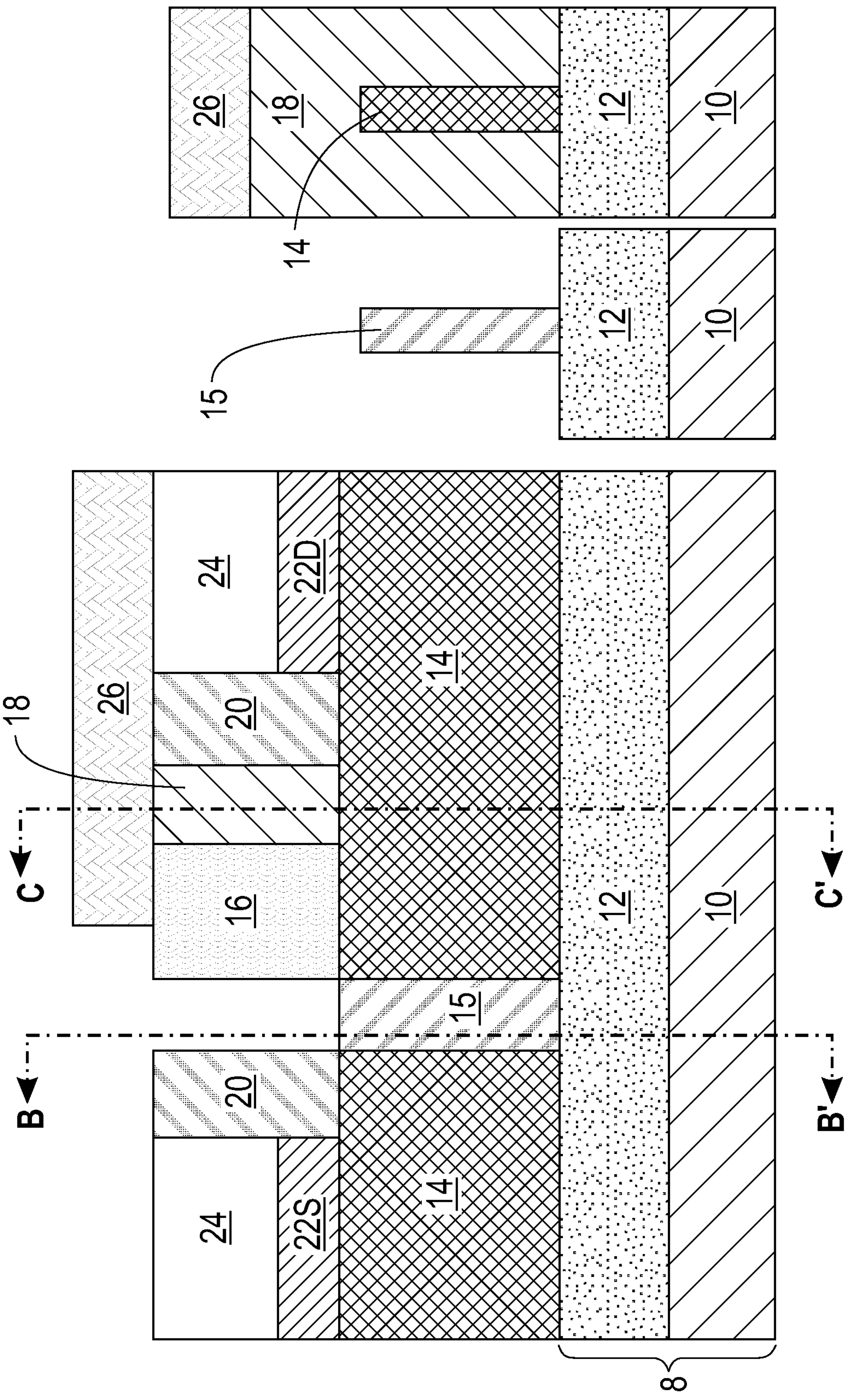
FIG. 8A is a cross sectional view of the exemplary semiconductor structure of FIG. 7A after forming a halo ion implantation region into the physically exposed portion of the semiconductor fin on the source side of the structure.
FIG. 8B is a cross sectional view of the exemplary semiconductor structure of FIG. 8A through line B-B'.
FIG. 8C is a cross sectional view of the exemplary semiconductor structure of FIG. 8A through line C-C'.

Referring now to FIGS. 8A, 8B and 8C, there are illustrated varies views of the exemplary semiconductor structure of FIG. 7A after forming a halo ion implantation region 15 into the physically exposed portion of the semiconductor fin 14 on the source side 100 of the structure. The halo ion implantation region 15 will be present in portion of a channel region of the semiconductor fin 14 and will be located directly beneath a portion of a functional gate structure to be subsequently formed on the semiconductor fin 14. The channel region of the semiconductor fin 14 is the area of the semiconductor fin that is located directly beneath the functional gate structure to be subsequently formed. In FIGS. 10A, 10B, and 10C, the channel region is labeled as C1.

The halo ion implantation region 15 can be formed by plasma implantation of a p-type dopant or an n-type dopant, as defined above. P-type dopants are plasma implanted into the physically exposed portion of the semiconductor fin 14 when an n-type field effect transistor is to be subsequently formed, while n-type dopants are plasma implanted into the physically exposed portion of the semiconductor fin 14 when a p-type field effect transistor is to be subsequently formed. The halo ion implantation region 15 has a fin-like structure and is composed of a same semiconductor material as the semiconductor fin 14 and a p-type dopant or an n-type dopant, as defined above. The dopant concentration in the halo ion implantation region 15 is higher than the remaining portion of the channel region (i.e., the non-halo ion implantation region) of the semiconductor fin 14. In one embodiment, the dopant concentration in the halo ion implantation region 15 may be from $5\times10^{17}$ atoms/cm$^3$ to $5\times10^{18}$ atoms/cm$^3$. The halo ion implantation region 15 has a higher threshold voltage that is in close proximity to the source structure 22S than the remaining portion of the channel region of the semiconductor fin 14 (i.e., the non-halo ion implantation region). The ratio of high threshold voltage of the channel region to the low threshold voltage of the channel region can be controlled by the thickness of the first spacer 18. The presence of the halo ion implantation region 15 in the channel region of the functional gate structure will improve device performance. The halo ion implantation region 15 typically represents from 20 to 50% of the channel region.

In one embodiment, the halo ion implantation region 15 may extend from a topmost surface of the semiconductor fin 14 to a bottommost surface of the semiconductor fin 14. The halo ion implantation region 15 which is present on the source side 100 of the structure will provide an asymmetric threshold voltage distribution to the resultant FinFET. Thus, the halo ion implantation region 15 may be referred to herein as a 'threshold voltage modifying structure'.

Figures 9A, 9B, 9C:
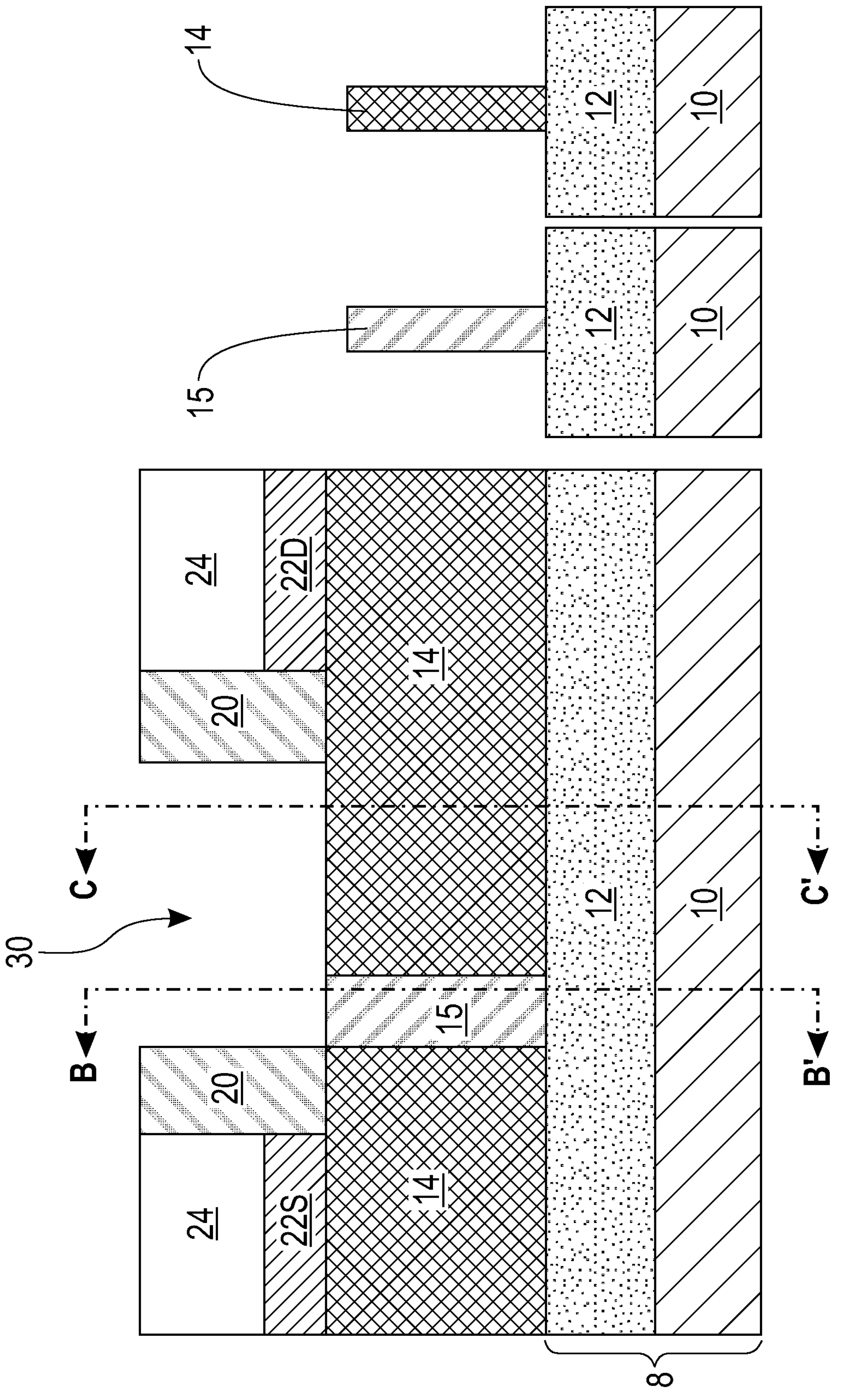
FIG. 9A is a cross sectional view of the semiconductor structure of FIG. 8A after removing the mask, the first spacer that is present on the drain side of the structure and the sacrificial gate structure.
FIG. 9B is a cross sectional view of the exemplary semiconductor structure of FIG. 9A through line B-B'.
FIG. 9C is a cross sectional view of the exemplary semiconductor structure of FIG. 9A through line C-C'.

Referring now to FIGS. 9A, 9B and 9C, there are illustrated various views of the semiconductor structure of FIG. 8A after removing the mask 26, the first spacer 18 that is present on the drain side 102 of the structure and the sacrificial gate structure 16. Mask 26 may be removed utilizing any material removal process such as, for example, CMP or etching. After removing the mask 26, the first spacer 18 that is present on the drain side 102 of the structure is now physically exposed and it may be removed utilizing an etching process that is selective in removing the first spacer 18. The sacrificial gate structure 16 can be removed either prior to, or after the removal of the first spacer 18 on the drain side 102 utilizing an etching process that is selective in removing the sacrificial gate structure 16. Gate cavity 38 is formed as is shown in FIG. 9A. The gate cavity 30 is located between the second spacers 20 and includes the volume (or area) of the sacrificial gate structure and both first spacers 18.

Referring now to FIGS. 10A, 10B and 10C, there are illustrated various views of the exemplary semiconductor structure of FIG. 9A after forming a functional gate structure (32, 34); in FIG. 10A element C1 denotes a channel region having an asymmetric threshold voltage distribution. As is shown, the C1 includes the halo ion implantation region 15 (which provides a high threshold voltage) in close proximity to the source structure 22S, and a laterally adjoining non-halo ion implantation region 17 of the semiconductor fin 14 (which provides a lower threshold voltage). By "functional gate structure" it is meant a permanent gate structure used to control output current (i.e., flow of carriers in the channel) of a semiconducting device through electrical or magnetic fields. The functional gate structure (32, 34) has a source side 100 including source structure 22S, and a drain side 102 including drain structure 22D.

The functional gate structure (32, 34) straddles over a portion of the semiconductor fin 14 as a well as the halo ion implantation region 15. The term "straddles over" denotes that a first material contains a first region present on a first side of a second material, and a second region that is present on a second side of the second material, wherein the two regions of the first material are interconnected by a third region of the first material that extends above a topmost surface of the second material.

The functional gate structure (32, 34) may include a gate dielectric portion 32 and a gate conductor portion 34. The gate dielectric portion 32 may include a gate dielectric material. The gate dielectric material that provides the gate dielectric portion 32 can be an oxide, nitride, and/or oxynitride. In one example, the gate dielectric material that provides the gate dielectric portion 32 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure composed of different gate dielectric materials, e.g., silicon dioxide, and a high-k gate dielectric, can be formed and used as the gate dielectric portion 32.

The gate dielectric material used in providing the gate dielectric portion 32 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric portion 32 can have a thickness in a range from 1 nm to 10 nm. Other thicknesses that are lesser than, or greater than, the aforementioned thickness range can also be employed for the gate dielectric material that may provide the gate dielectric portion 32.

The gate conductor portion 34 can include a gate conductor material. The gate conductor material used in providing the gate conductor portion 34 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor portion 34 may comprise an nFET gate metal. In another embodiment, the gate conductor portion 34 may comprise a pFET gate metal.

The gate conductor material used in providing the gate conductor portion 34 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor portion 34 can have a thickness from 50 nm to 200 nm. Other thicknesses that are lesser than, or greater than, the aforementioned thickness range can also be employed for the gate conductor material used in providing the gate conductor portion 34.

The functional gate structure (32, 34) can be formed by providing a functional gate material stack of the gate dielectric material, and the gate conductor material. A planarization process may follow the formation of the functional gate material stack. In some embodiments, the gate dielectric portion 32 is U-shaped. By "U-shaped" it is meant that a material has a horizontal portion and vertical portion that extends upwards from each end of the horizontal portion. In such an embodiment, the U-shaped gate dielectric material portion has a topmost surface that is coplanar with a topmost surface of the gate conductor portion 34.

FIG. 10A also shows the structure after forming a drain contact structure 36D contacting a surface of the drain structure 22D and a source contact structure 36S contacting a surface of the source structure 22S. The various contact structures (36D, 36S) can be formed by first providing contact openings (not shown) into the ILD layer 24 to expose the source structure 22S and the drain structure 22DS. The contact openings can be formed by lithography and etching. Each contact opening is then filled with a contact metal or metal alloy. Examples of contact metals include, but are not limited to, tungsten (W), aluminum (Al), copper (Cu), or cobalt (Co). An example of a contact metal alloy is Cu—Al alloy. A planarization process may follow the filling of each contact opening with the contact metal or metal alloy. The various contact structures (34D, 36SA) are embedded in the ILD layer 24.

Referring still to FIGS. 10A, 10B, and 10C, there is illustrated a semiconductor structure of the present application. The structure includes a semiconductor fin 14 located on a surface of a substrate 8. A functional gate structure (32, 34) is located on a channel region, C1, of the semiconductor fin 14. A source structure 22S is located on the semiconductor fin 14 and present on a source side 100 of the functional gate structure (32, 34), and a drain structure 22D is located on the semiconductor fin 14 and present on a drain side 102 of the functional gate structure. The channel region, C1, includes a non-halo ion implantation region 17 and a halo ion implantation region 15. The halo ion implantation region 15 has a higher dopant concentration than the non-halo ion implantation region, is located on the source side 100 and is laterally adjacent to the non-halo ion implantation region 17. The halo ion implantation region 15 which is present on the source side 100 of the structure will provide an asymmetric threshold voltage distribution to the resultant FinFET. Notably, the halo ion implantation region 15 has a higher threshold voltage that is in close proximity to the source structure 22S than the remaining portion of the channel region, C1, of the semiconductor fin 14 (i.e., the non-halo ion implantation region 17).

As is shown in FIG. 10A, a second spacer 20 is present on the source side 100 and drain side 102 of the structure, wherein the second spacer 20 is laterally adjacent, and in contact with, an outermost sidewall surface of the functional gate structure (32, 34). As is further shown, the second spacer on the source side 100 separates the source structure 22S from the functional gate structure (32, 34), and the second spacer 20 on the drain side 102 separates the drain structure 22D from the functional gate structure (32, 34). As is even further shown, an outermost sidewall surface of the halo ion implantation region 15 is vertically aligned to an innermost sidewall of the second spacer 20 present on the source side 100 of the structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:

a functional gate structure located on a channel region of a semiconductor fin;

a source structure located on the semiconductor fin and on a source side of the functional gate structure; and a drain structure located on the semiconductor fin and present on a drain side of the functional gate structure, wherein the channel region comprises a non-halo ion implantation region and a halo ion implantation region, wherein the halo ion implantation region has a higher dopant concentration than the non-halo ion implantation region, is located on the source side and is laterally adjacent to the non-halo ion implantation region, and wherein the halo ion implantation region extends from a topmost surface of the semiconductor fin to a bottommost surface of the semiconductor fin.

2. The semiconductor structure of claim 1, further comprising a spacer present on the source side and the drain side, wherein the spacer is laterally adjacent, and in contact with, an outermost sidewall surface of the functional gate structure.

3. The semiconductor structure of claim 2, wherein the spacer on the source side separates the source structure from the functional gate structure, and the spacer on the drain side separates the drain structure from the functional gate structure.

4. The semiconductor structure of claim 2, wherein an outermost sidewall surface of the halo ion implantation region is vertically aligned to an innermost sidewall of the spacer present on the source side.

5. The semiconductor structure of claim 2, further comprising an interlayer dielectric layer laterally surrounding the spacer present on the source side and the drain side.

6. The semiconductor structure of claim 1, wherein the halo ion implantation region represents from 20 to 50% of the channel region.

7. The semiconductor structure of claim 1, wherein the halo ion implantation region includes an n-type dopant, and the functional gate structure is a p-type FET.

8. The semiconductor structure of claim 1, wherein the halo ion implantation region includes a p-type dopant, and the functional gate structure is an n-type FET.

9. The semiconductor structure of claim 1, wherein the halo ion implantation region and the semiconductor fin are composed of a same semiconductor material.

10. The semiconductor structure of claim 1, further comprising a source contact structure contacting a surface of the source structure and a drain contact structure contacting a surface of the drain structure.

11. A semiconductor structure comprising:

a functional gate structure located on a channel region of a semiconductor fin;

a source structure located on the semiconductor fin and on a source side of the functional gate structure; and a drain structure located on the semiconductor fin and present on a drain side of the functional gate structure, wherein the channel region comprises a non-halo ion implantation region and a halo ion implantation region, wherein the halo ion implantation region has a higher dopant concentration than the non-halo ion implantation region, is located on the source side and is laterally adjacent to the non-halo ion implantation region, and wherein the halo ion implantation region represents from 20 to 50% of the channel region.

12. A semiconductor structure comprising:

a functional gate structure located on a channel region of a semiconductor fin;

a source structure located on the semiconductor fin and on a source side of the functional gate structure;

a drain structure located on the semiconductor fin and present on a drain side of the functional gate structure, wherein the channel region comprises a non-halo ion implantation region and a halo ion implantation region, wherein the halo ion implantation region has a higher dopant concentration than the non-halo ion implantation region, is located on the source side and is laterally adjacent to the non-halo ion implantation region; and a spacer present on the source side and the drain side, wherein the spacer is laterally adjacent, and in contact with, an outermost sidewall surface of the functional gate structure, wherein the spacer on the source side separates the source structure from the functional gate structure, and the spacer on the drain side separates the drain structure from the functional gate structure.

13. The semiconductor structure of claim 12, wherein the halo ion implantation region extends from a topmost surface of the semiconductor fin to a bottommost surface of the semiconductor fin.

* * * * *